(12) United States Patent
Tan et al.

(10) Patent No.: US 12,490,568 B2
(45) Date of Patent: Dec. 2, 2025

(54) METHOD OF FORMING A DIELECTRIC COLLAR FOR SEMICONDUCTOR WIRES

(71) Applicant: ALEDIA, Echirolles (FR)

(72) Inventors: Wei Sin Tan, Echirolles (FR); Pamela Rueda Fonseca, Fontaine (FR); Pierre Tchoulfian, Grenoble (FR)

(73) Assignee: ALEDIA, Echirolles (FR)

( * ) Notice: Subject to any disclaimer, the term of this patent is extended or adjusted under 35 U.S.C. 154(b) by 553 days.

(21) Appl. No.: 17/767,608

(22) PCT Filed: Oct. 1, 2020

(86) PCT No.: PCT/EP2020/077580
§ 371 (c)(1),
(2) Date: Apr. 8, 2022

(87) PCT Pub. No.: WO2021/069310
PCT Pub. Date: Apr. 15, 2021

(65) Prior Publication Data
US 2023/0343811 A1    Oct. 26, 2023

(30) Foreign Application Priority Data
Oct. 11, 2019    (EP) .................................... 19315121

(51) Int. Cl.
*H10H 20/821*    (2025.01)
*H10H 29/14*    (2025.01)
(Continued)

(52) U.S. Cl.
CPC ......... *H10H 29/142* (2025.01); *H10H 20/032* (2025.01); *H10H 20/034* (2025.01);
(Continued)

(58) Field of Classification Search
None
See application file for complete search history.

(56) References Cited

U.S. PATENT DOCUMENTS

2010/0176375 A1\* 7/2010 Lochtefeld .............. H01L 33/06
                                                    257/655
2013/0221385 A1\* 8/2013 Shibata ................ H10H 20/858
                                                    438/33
(Continued)

OTHER PUBLICATIONS

International Search Report issued in corresponding International Application No. PCT/EP2020/077580, mailed Dec. 2, 2020, pp. 1-3, European Patent Office, Rijswijk, Netherlands.
(Continued)

*Primary Examiner* — Kretelia Graham
*Assistant Examiner* — William Henry Anderson
(74) *Attorney, Agent, or Firm* — HAUPTMAN HAM, LLP

(57) ABSTRACT

A method of forming a dielectric collar for semiconductor wires includes providing a layers stack and a semiconductor wires (SW) layer on top of the stack, forming a base layer at a lower part of the SW and a capping layer at an upper part of the SW, the base layer parallel to the basal plane and including a dielectric material surrounding the lower part of the SW, and the capping layer along a contour of the SW and including a dielectric material surrounding the upper part of the SW, the base and capping layers having thicknesses e1 and e2 with e1>2.e2, performing anisotropic etching along the direction normal to the basal plane to remove the dielectric material at a top part of the SW and leaving the dielectric material at least in the lower part of the SW.

15 Claims, 6 Drawing Sheets

(51) Int. Cl.
*H10H 20/01* (2025.01)
*H10H 20/818* (2025.01)
*H10H 20/84* (2025.01)

(52) U.S. Cl.
CPC ......... *H10H 20/818* (2025.01); *H10H 20/821* (2025.01); *H10H 20/84* (2025.01)

(56) References Cited

U.S. PATENT DOCUMENTS

| | | | |
|---|---|---|---|
| 2013/0341658 A1* | 12/2013 | Lee | H01L 33/24 977/762 |
| 2017/0194273 A1* | 7/2017 | Chen | H01L 25/0657 |
| 2018/0198047 A1* | 7/2018 | Danesh | H01L 33/24 |

OTHER PUBLICATIONS

Written Opinion issued in corresponding International Application No. PCT/EP2020/077580, mailed Dec. 2, 2020, pp. 1-5, European Patent Office, Rijswijk, Netherlands.

* cited by examiner

METHOD OF FORMING A DIELECTRIC COLLAR FOR SEMICONDUCTOR WIRES

The present application is a U.S. National Phase of International Application Number PCT/EP2020/077580, filed Oct. 1, 2020, which claims priority to European Application No. 19315121.4, filed Oct. 11, 2019, the entirety of each of which are incorporated herein by reference.

TECHNICAL FIELD

The invention concerns the field of semiconductor technologies. It may relate more particularly to the manufacture of components based on small semiconductor wires having typically a diameter ranging from some tens of nanometers to some micrometers. The invention can be worthily implemented in the manufacturing of wires- or nanowires-based light emitting diode (W-LED or NW-LED).

BACKGROUND

In the field of semiconductor technologies, three-dimensional arrays of semiconductor wires (SW) are considered as promising alternatives to two-dimensional planar semiconductor structures.

In particular, such 3D arrays may improve the overall efficiency of optoelectronics devices such as LED, which require good crystal quality for light emission, as well as good optical properties for light extraction.

In general, the upper part of the semiconductor wires has a better crystal quality than the lower part of the SW.

Such a difference in crystal quality between upper and lower parts of SW may induce leakage current at the lower part of SW in a SW-based LED device.

The leakage current induced at the lower part of SW is detrimental for SW-based LED device performances, especially in case of large devices such as high resolution micro-displays, for example smartwatch displays.

A solution to minimize the leakage current is to form a dielectric collar surrounding the lower part of SW.

FIGS. 1A to 1E show typical steps of a dielectric collar formation method.

From a 3D array or layer 20 comprising SW 21 (FIG. 1A), a conformal dielectric layer 50 is first deposited (FIG. 1B).

A masking layer 51 is then deposited, for instance by spin-coating, in order to protect the lower part of the SW 21 while exposing the upper part of the SW 21 (FIG. 1C).

An isotropic etching is then performed in order to remove the exposed part of the dielectric layer 50 surrounding the upper part of the SW 21 (FIG. 1D).

The masking layer 51 is finally removed (FIG. 1E). A dielectric collar 22 surrounding the lower part of the SW 21 is thus obtained.

Such a dielectric collar formation method is however not suitable in case of SW having different heights, as illustrated in FIG. 1F.

Applying the above-mentioned method to SW having different heights would indeed result in upper parts either too high or too low (FIG. 1F).

An effective dielectric collar cannot be obtained for all the SW regardless of their heights.

It is ultimately detrimental for the yield of such SW-based devices.

The present invention is intended to overcome at least partially some of the aforementioned drawbacks.

More precisely, an object of the present invention is a method of forming a dielectric collar for SW regardless of their heights.

The other objects, characteristics and advantages of the present invention will appear in the examination of the following description and accompanying drawings. It is to be understood that other benefits may be incorporated.

SUMMARY

To achieve these objectives, the invention provides a method of forming a dielectric collar for semiconductor wires comprising the following steps:

Providing a stack of layers comprising at least a substrate spreading along a basal plane, and a semiconductor wires (SW) layer lying on top of the stack and comprising semiconductor wires in a semiconductor-based material, said semiconductor wires being mainly oriented along a direction normal to the basal plane, Forming, at least partially by spin coating, a base layer at a lower part of the SW, and possibly a capping layer at an upper part of the SW, the base layer spreading parallel to the basal plane and comprising at least a dielectric material surrounding the lower part of the SW, and the capping layer spreading along a contour of the SW and comprising at least the dielectric material surrounding the upper part of the SW, the base layer and the capping layer having respectively a thickness $e1>0$ and a thickness $e2 \geq 0$ with $e1 > 2.e2$, Performing an anisotropic etching along the direction normal to the basal plane so as to remove the dielectric material at least at a top part of the upper part of the SW over a height h and to leave the dielectric material at least in the lower part of the SW.

This method is advantageously designed to globally form dielectric collars for all SW, whereas each of the so formed dielectric collars is automatically adjusted to the height of each corresponding individual SW.

The base layer spreads along the basal plane with a thickness e1, forming a bulk layer at the lower part of the SW. It advantageously prevents from etching the stack during the subsequent anisotropic etching.

The capping layer may not be formed, or not fully formed, depending on the conditions of spin coating for instance. Anyway the formation of this capping layer is configured so that it spreads along a contour of the SW in the upper parts of the SW, with a thickness $e2 < e1$ (e2 may be zero). The capping layer is thinner, preferably much thinner, than the base layer and will be etched faster than the base layer during the subsequent anisotropic etching.

The anisotropic etching thus allows the top part of the SW to be exposed while keeping the dielectric material surrounding at least the lower part of the SW.

As the anisotropic etching is performed along the direction normal to the basal plane, the dielectric material is first removed at the top of the SW and then continues to be removed along the sidewalls of the SW.

The dielectric material is thus removed from a same height h defining the top part of the SW whatever the effective height of the SW.

The dielectric material surrounding the lower part of the SW is protected during the anisotropic etching.

In this way, a dielectric collar is formed for each of the SW and the height of this dielectric collar is proportional to the height of the SW.

The SW often have height variations and it is an advantage of the present invention to free the top part of the SW having the best crystal quality, for all the SW, while providing an effective dielectric collar at the lower part of the SW.

The method according to the invention is therefore more efficient than known dielectric collar formation methods for SW.

Further anisotropic etching of the base layer may be performed, so as to expose the surface of the underlying stack.

It may avoid wave guiding effects at the underlying stack, which is especially interesting for SW-based LED manufacturing.

Another object of the present invention is a method for manufacturing of semiconductor wires-based light emitting diode (SW-LED) which comprises the method claimed above.

It is noteworthy that such a SW-LED manufacturing method is fully compatible with the subsequent classical technological steps involved in the manufacturing of a LED.

The overall SW-LED manufacturing method is then cost effective.

BRIEF DESCRIPTION OF THE DRAWINGS

Embodiments of the invention are illustrated by the following accompanying drawings in which.

Figure 1A:
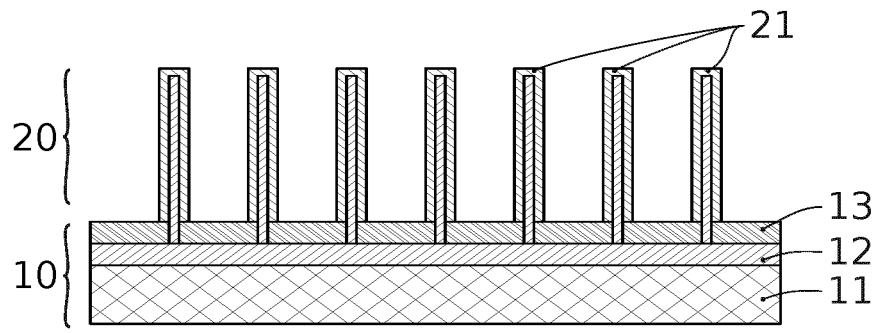
FIGS. 1A to 1F show steps of a dielectric collar formation method for SW according to the prior art.
Figure 1B:
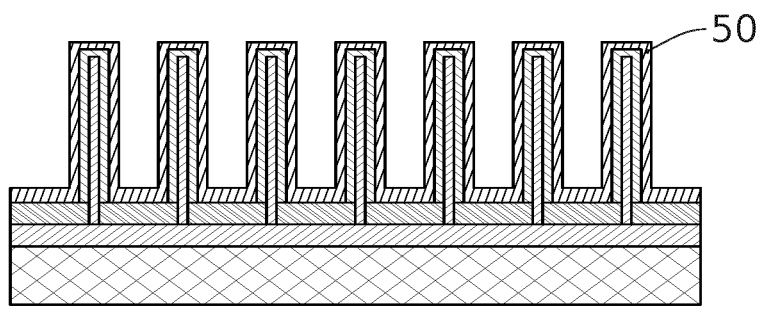
Figure 1C:
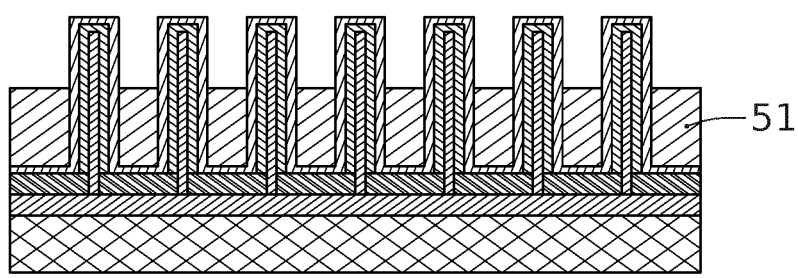
Figure 1D:
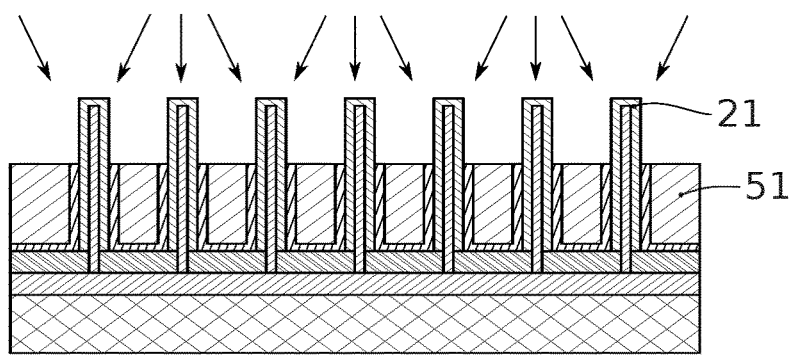
Figure 1E:
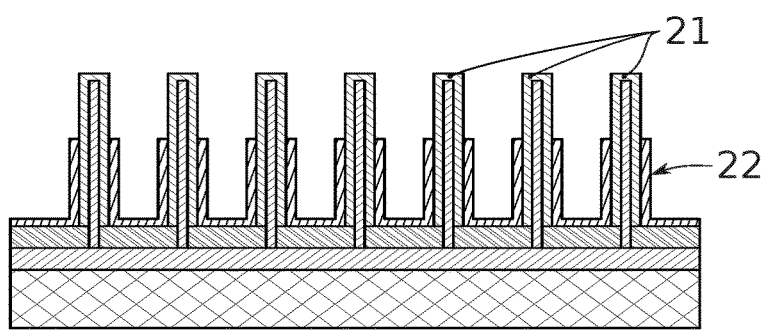
Figure 1F:
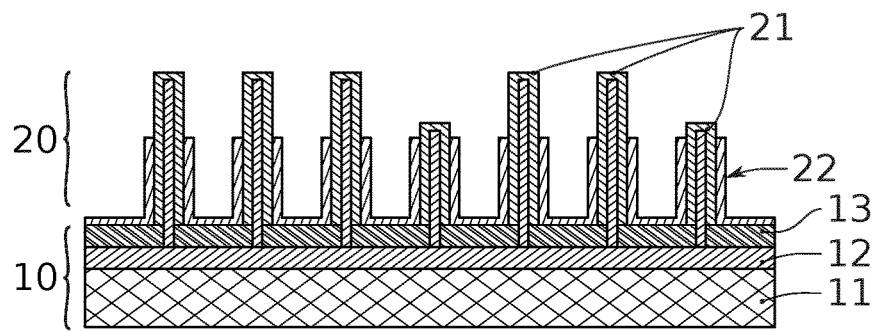

The drawings are given as examples and are not restrictive of the invention. They are schematic representations of principle intended to facilitate the understanding of the invention and are not necessarily on the scale of practical applications. In particular, the height, thicknesses and dimensions of the SW and of the different layers and regions of the LEDs shown are not representative of reality.

DETAILED DESCRIPTION

Before beginning a detailed review of embodiments of the invention, are set forth below optional features that can optionally be used in combination or alternatively:

According to one embodiment, the base and capping layers both comprise the dielectric material and a photoresist material, and are formed from a first conformal deposition of the dielectric material followed by a second deposition of the photoresist material by spin coating.

In this case, the dielectric material is deposited with an approximately constant thickness all along the SW. The thickness uniformity at the sidewalls of the SW, especially in the upper part of the SW, is improved. The thickness control at the sidewalls of the SW, especially in the upper part of the SW, is optimized.

According to one embodiment, the conformal deposition of the dielectric material is performed by one of the following deposition techniques: plasma-enhanced chemical vapor deposition (PECVD), Sub-atmospheric chemical vapor deposition (SACVD), Low Pressure Chemical Vapor Deposition (LPCVD), Atomic Layer Deposition (ALD).

According to one embodiment, the base and capping layers both comprise only the dielectric material, and are formed only from a spin coating deposition of the dielectric material.

In this case, the base and capping layers formation is simplified.

According to one embodiment, the anisotropic etching is continued so as to expose a surface of the stack.

In this case, wave guiding effects at the vicinity of the surface of the stack are avoided.

According to one embodiment, the dielectric material is chosen among: SiO2, SiN or SiON.

According to one embodiment, the anisotropic etching is performed using at least a plasma comprising fluorocarbonated species. The anisotropic etching is typically performed using reactive ion etching (RIE) or inductively coupled plasma (ICP).

According to one embodiment, the anisotropic etching has an etching selectivity S1 between the dielectric material and the semiconductor material with S1>100:1.

According to one embodiment, the anisotropic etching has an etching selectivity S2 between the dielectric material and a material at the surface of the stack with S2>100:1.

According to one embodiment, the semiconductor wires have a height between 1 μm and 15 μm and a diameter between 0.7 μm and 3 μm.

According to one embodiment, the stack of layers comprises at least a substrate, a nucleation layer, a growth masking layer, and wherein the semiconductor wires are at least partially grown from the nucleation layer through the growth masking layer.

According to one embodiment, the semiconductor-based material comprises gallium nitride (GaN).

According to one embodiment, e1>500 nm.

According to one embodiment, the top part of the SW has a height h in the range 300 nm to 10 μm.

According to one embodiment, the top part of the SW has a height h' in the range 600 nm to 12 μm.

In the present invention, the dielectric collar formation method for SW is in particular dedicated to the manufacture of SW-based optoelectronic devices, in particular LEDs. A LED typically includes p- and n-doped regions in relation with an active region where the light is emitted.

However it is to be understood that this method can be used for the manufacture of other microelectronic devices, for example in the field of transistors or MEMS.

Unless explicitly stated, it is specified that, in the context of this invention, the relative arrangement of a third layer between a first layer and a second layer does not necessarily mean that the layers are in direct contact with each other, but means that the third layer is either in direct contact with the first and second layers or separated from each other by at least one other layer or at least one other element.

In this invention, types of doping are indicated. The corresponding dopings are not exhaustive examples. The invention covers all modes of implementation in which doping is reversed. Thus, if an embodiment mentions for a first layer of a SW a p-doping and for a second layer of the SW a n-doping, then this description implicitly describes, at least, the opposite example in which the first layer presents an n-doping and the second layer presents a p-doping.

A p-doping includes all doping by positive charge carriers regardless of the concentration of dopants. Thus, a p-doping can be defined as a p, p+ or p++ doping. Similarly, an n-doping includes all doping by negative charge carriers regardless of the concentration of dopants. Thus, an n-doping can be defined as an n, n+ or n++ doping.

The following abbreviations for a material M may be used:

i-M refers to the intrinsic or not intentionally doped material M, according to the terminology usually used in the field of microelectronics for the prefix i-.

n-M refers to the n-doped material M according to the terminology usually used in the field of microelectronics for prefix n-.

p-M refers to the p-doped material M according to the terminology usually used in the field of microelectronics for prefix p-.

A device, a substrate, a layer, a SW, "based" on a material M, means a device, a substrate, a layer, a SW comprising this material M only or this material M and possibly other materials, for example alloying elements, impurities or doping elements. For example, a gallium nitride (GaN) SW may include gallium nitride (GaN or i-GaN) and/or doped gallium nitride (p-GaN, n-GaN) and/or gallium-indium nitride (InGaN) and/or gallium-aluminum nitride (AlGaN).

In the present application, we will preferably talk about thickness for a layer, height for a SW, and depth for an etching for example. The thickness of a layer is taken perpendicularly to the main spreading of the layer. The height of a SW or of a part of a SW is taken perpendicularly to the basal plane.

The terms "substantially", "approximately", "about" mean "to the nearest 10%" or, in the case of an angular orientation, "to the nearest 10°". Thus, a direction substantially normal to a plane means a direction with an angle of 90±10° to the plane.

In order to determine whether a SW-based device has been manufactured from the method of this invention, scanning electron microscopy (SEM) or transmission electron microscopy (TEM) analysis may be performed.

In particular, an observation at the upper part of the SW may determine whether the top part of the SW without dielectric material has about a constant height whatever the height of the SW.

This may be a serious indication of the use of this method.

A first embodiment of the dielectric collar formation method for SW according to the invention will now be described with reference to FIGS. 2A to 2F.

SW 21 may be grown on a planar stack 10 of layers 11, 12, 13 comprising at least a substrate 11.

The substrate 11 may be made of silicon, GaN or sapphire.

Figure 2A:
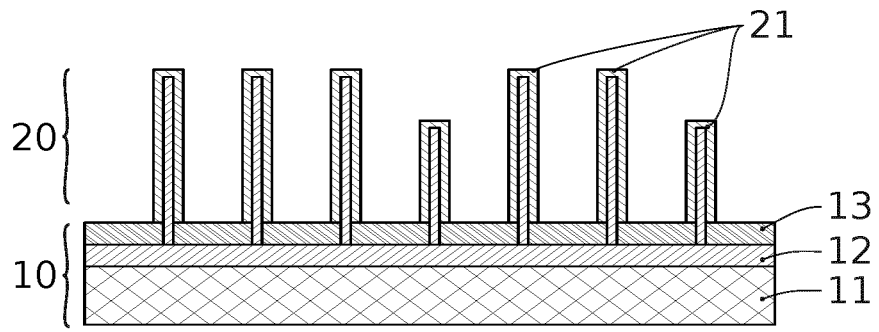
FIGS. 2A to 2G show steps of a SW-LED manufacturing method comprising a dielectric collar formation according to one embodiment of the present invention.

Each layer 12, 13 of the stack 10 are typically arranged on the substrate 11, extending parallel to a basal plane, so as the stack 10 is formed in a direction normal to the basal plane (FIG. 2A).

The stack 10 may include a two-dimensional (2D) nucleation layer 12 overlaid by a growth masking layer hereafter referred as Selective Area Growth (SAG) layer 13.

Both 2D nucleation layer 12 and SAG layer 13 are preferably directly in contact to each other.

The 2D nucleation layer 12 may be made of aluminum indium gallium nitride(Al)(In)(Ga)N, or of aluminum nitride AlN, or of indium gallium nitride (In)(Ga)N, or of gallium nitride GaN or of tantalum, or of tantalum nitride, or of niobium, or of niobium nitride, or of titanium, or of titanium nitride, or of hafnium, or of hafnium nitride, or of boron, or of boron nitride, or of magnesium, or of magnesium nitride, or of tungsten, or of tungsten nitride, or of a combination thereof.

The 2D nucleation layer 12 may have a thickness in the range 5 nm to 50 nm, typically 25 nm.

The SAG layer 13 may be made of silicon nitride (SiN), silicon oxide (SiO2), silicon oxide nitride (SiON), hafnium oxide (HfO2), hafnium nitride (HfN), scandium oxide (Sc2O3), scandium nitride (ScN), magnesium oxide (Mg2O3) or other materials. The SAG layer 13 may be made of a single layer or of a multilayer stack.

The SAG layer 13 may have a thickness in the range 20 nm to 500 nm, typically 100 nm.

Holes or apertures may be regularly distributed throughout the SAG layer 13 so as to expose the underlying 2D nucleation layer 12.

These holes may have a diameter ranging from some tens of nanometers to some micrometers, for example about 0.5 μm.

These holes can be specifically designed to assist a local growth of SW 21 from the nucleation layer 12 through the SAG layer 13.

SW 21 can be grown by different growth techniques depending on the desired internal structure of the SW 21. The internal structure may be a longitudinal structure or a radial structure.

For example, SW 21 having the longitudinal structure can be grown by Molecular Beam Epitaxy (MBE) or by metal organic chemical vapor deposition (MOCVD) or Atomic Layer Deposition (ALD) or remote plasma chemical vapor deposition (RP-CVD) or a combination thereof or by HVPE (hydride vapor phase epitaxy).

For GaN-based SW 21, such a longitudinal structure may include p-GaN and n-GaN regions arranged according to the direction normal to the basal plane, with InGaN quantum wells in between.

SW 21 having the radial structure, also referred as core-shell structure, can be grown by Metal-Organic Chemical Vapor Deposition (MOCVD), or by Metal-Organic Vapor Phase Epitaxy (MOVPE), or by remote plasma chemical vapor deposition (RP-CVD) or by Hydride Vapor Phase Epitaxy (HVPE), or by Molecular Beam Epitaxy (MBE).

For GaN-based SW 21, such a radial structure may include p-GaN, InGaN and n-GaN regions concentrically arranged around an axis normal to the basal plane.

Figure 4:
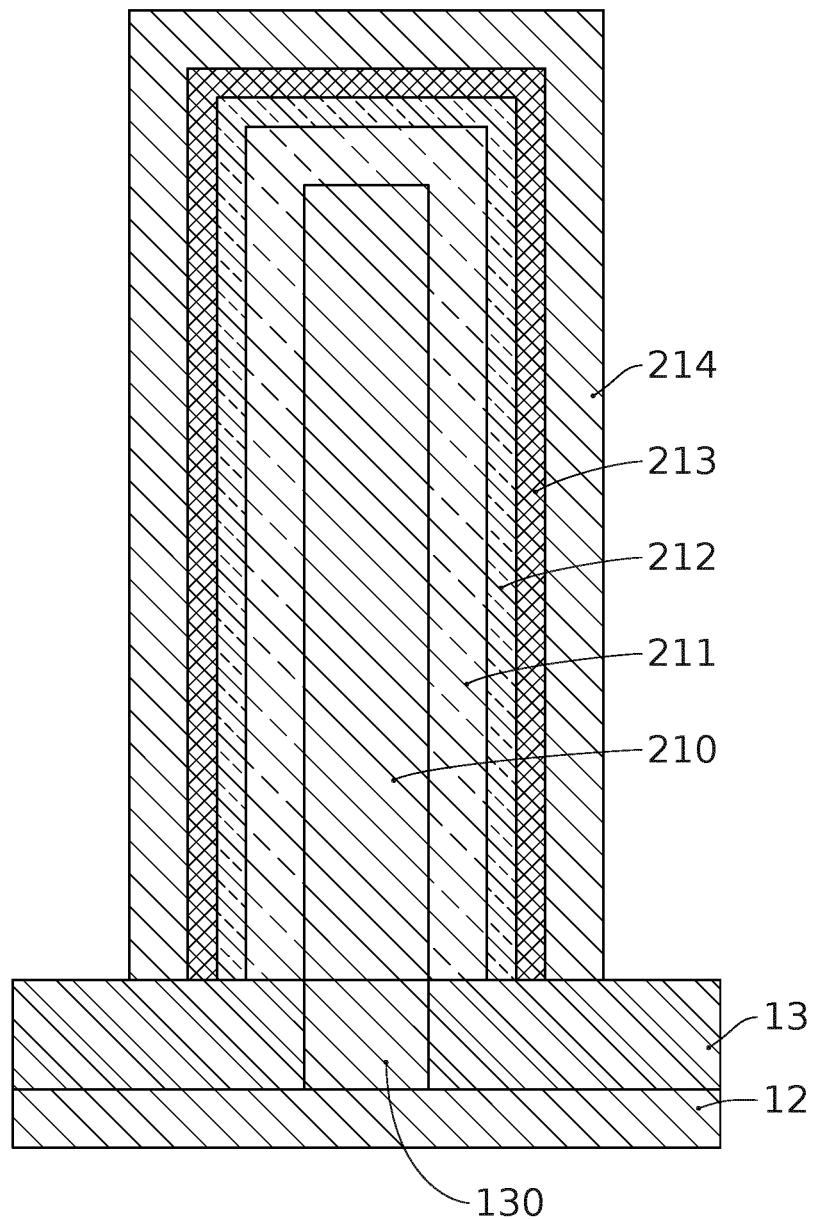
FIG. 4 is a close-up of a SW according to an embodiment of the present invention.

FIG. 4 shows a particular arrangement for such a radial structure.

SW 21 can include the following sequence of regions or layers, from the inside to the outside of the SW in a radial direction:

A core 210 having a diameter in the range 50 nm to 1.2 μm, typically 700 nm. The core 210 is preferably made of GaN.

A shell 211 having a thickness in the range 50 nm to 500 nm, typically 250 nm. The shell 211 is preferably made of n-GaN.

An active region 212 having a thickness in the range 20 nm to 250 nm, typically 40 nm. The active region 212 is preferably made of InGaN. The active region 212 preferably includes i-InGaN quantum wells (OW) alternating with i-GaN quantum barriers (QB). QW may have a thickness in the range 1 nm to 15 nm and QB may have a thickness in the range 3 nm to 20 nm.

An Electron Blocking Layer (EBL) 213 having a thickness in the range 10 nm to 100 nm, typically 30 nm. The EBL 213 is preferably made of AlGaN.

An outside region 214 having a thickness in the range 50 nm to 500 nm, typically 250 nm. The outside region 214 is preferably made of p-GaN.

The core 210 of the SW 21 is first grown, for instance by MOCVD, through the holes 130 of the SAG layer 13. Then, layers 211, 212, 213, 214 may be successively grown on one another so as to form a radial structure, preferably as illustrated in FIG. 4.

For convenience, SW 21 are illustrated in the following with a simple core-shell structure, regardless of the effective number of layers in the radial structure. It has also to be understood that this representation may also correspond to a longitudinal structure, if compatible.

After growth of the SW 21, a layer 20 of SW 21 regularly distributed on the stack 10 all over the wafer is advantageously obtained.

Figure 3A:
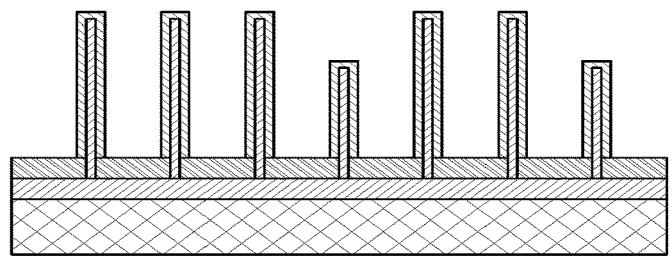
FIGS. 3A to 3E show steps of a SW-LED manufacturing method comprising a dielectric collar formation according to another embodiment of the present invention.

Providing such a layer 20 of SW 21 is prior to the following steps according to the method of the invention, which intends to form an effective dielectric collar for each individual NW 21 of the layer 20 (FIG. 2A, 3A).

Figure 2B:
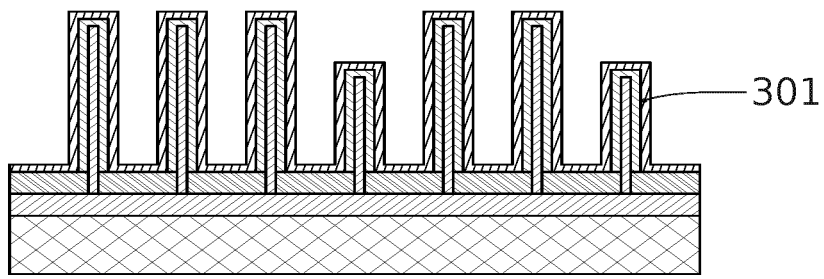

According to a first embodiment of the invention, a conformal dielectric layer 301 is first deposited on the NW 21, as illustrated in FIG. 2B.

Chemical Vapor Deposition (CVD) techniques such as plasma-enhanced chemical vapor deposition (PECVD), Sub-atmospheric chemical vapor deposition (SACVD), Low Pressure Chemical Vapor Deposition (LPCVD), Atomic Layer Deposition (ALD) may be used to perform the conformal deposition of the dielectric layer 301.

The conformal dielectric layer 301 is preferably 20 nm to 1000 nm thick. A part of this conformal dielectric layer 301 is ultimately intended to form the dielectric collar for the NW 21.

Therefore the following steps of the method are intended to shape this conformal dielectric layer 301 in such a way as to obtain the dielectric collar.

Figure 2C:
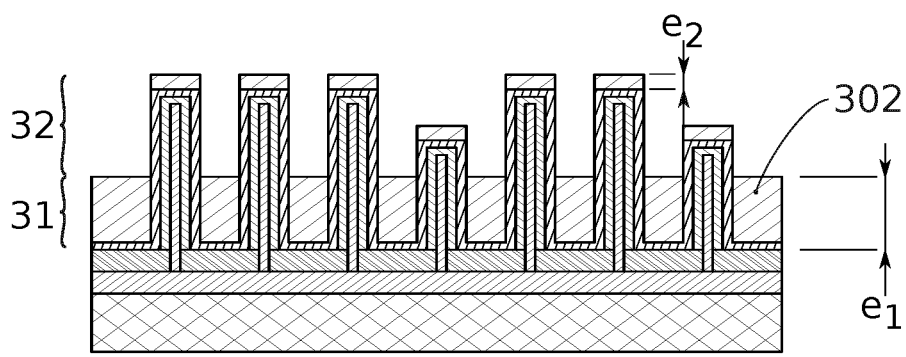

According to this first embodiment, a photoresist layer 302 is then deposited by spin coating on the NW 21, as illustrated in FIG. 2C.

Such a spin-coated photoresist layer 302 on SW 21 typically has a thick part (e1) lying between the SW 21, at a lower part of the SW 21, and possibly a thin part (e2) covering the top of the SW 21 and/or the sidewalls of the SW 21 at an upper part of the SW 21.

As known for spin coating deposition, it is possible to obtain a thick part having a thickness e1 in the range 600 nm to 6 μm thick together with a thin part having a thickness e2 in the range 0 nm to 200 nm thick.

The deposition result is known as depending first on the spin coating parameters and photoresist features, and second on the SW pitch and the aspect ratio of the SW (height over width). For example, spin coating photoresist on a tall and small diameter SW will lead to a thinner e2, compared with a short and wider diameter SW.

The thick part of this photoresist layer 302 and the underlying parts of the conformal dielectric layer 301 at the lower part of the SW 21 form a composite layer which corresponds to the base layer 31, as illustrated in FIG. 2C.

The thin part of this photoresist layer 302 and the possibly underlying parts of the conformal dielectric layer 301 at the upper part of the SW 21 form a composite layer which corresponds to the capping layer 32, as illustrated in FIG. 2C.

The thickness e1 of the base layer 31 is then approximately equal to the thickness of the thick part of the photoresist layer 302 and the thickness of the conformal dielectric layer 301. The thickness e1 is preferably determined in between the SW 21.

The thickness e2 of the capping layer 32 is then approximately equal to the thickness of the thin part of the photoresist layer 302 and the thickness of the conformal dielectric layer 301. The thickness e2 is preferably determined on top of the SW 21.

It is thus obtained a base layer 31 much thicker than the capping layer 32.

The base layer 31 is basically a continuous layer lying between the SW 21, at the lower part of the SW 21. It preferably fills all the gaps in between.

The capping layer 32 is basically a continuous layer covering the top of the SW 21 and possibly the sidewalls of the SW 21 at the upper part of the SW 21, without filling all the gaps in between.

Such base and capping layers 31, 32 can further be harnessed to strip the upper part of the SW 21 while preserving a cladding in the lower part of the SW 21.

In particular, an anisotropic etching is performed so as to expose a top part of the SW 21.

The anisotropic etching may be performed using successive etching conditions.

Figure 2D:
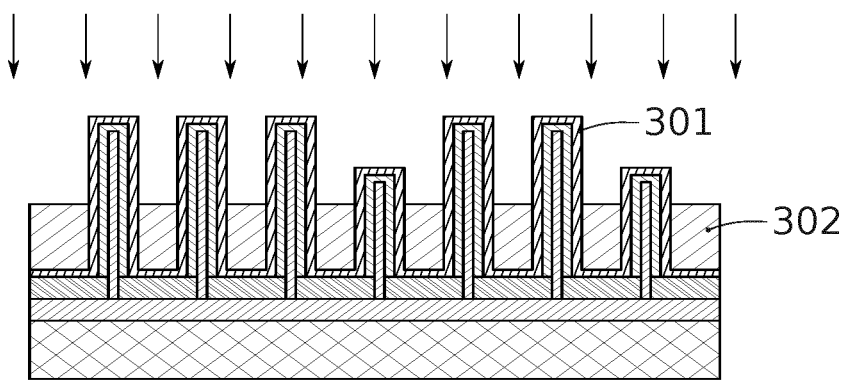

As illustrated in FIG. 2D, a first plasma etching of the thin part of the photoresist layer 302 is preferably performed.

This first plasma etching may typically involve oxygen species. Other plasmas, for instance based on reductive species, may also be used.

It can be isotropic or anisotropic.

Alternatively, in order to achieve the structure illustrated in FIG. 2D, a thick photoresist layer can be directly formed on the coated NW 21 illustrated in FIG. 2B.

Such a thick photoresist layer is preferably thicker than the SW height.

It may be deposited either by means of spin-coating, spray coating or other conventional methods.

After deposition, an anisotropic etching step is done to reduce the photoresist resist thickness until the top parts of all the nanowires are exposed, as depicted in FIG. 2D.

This etching step is required to be selective only to photoresist, so as to not etch SiO2 or GaN layer/materials.

This can be readily done by using anisotropic oxygen plasma processes.

In this alternative embodiment, the step illustrated in FIG. 2C is bypassed. It is thus not necessary to precisely control the spin coating parameters.

Figure 2E:
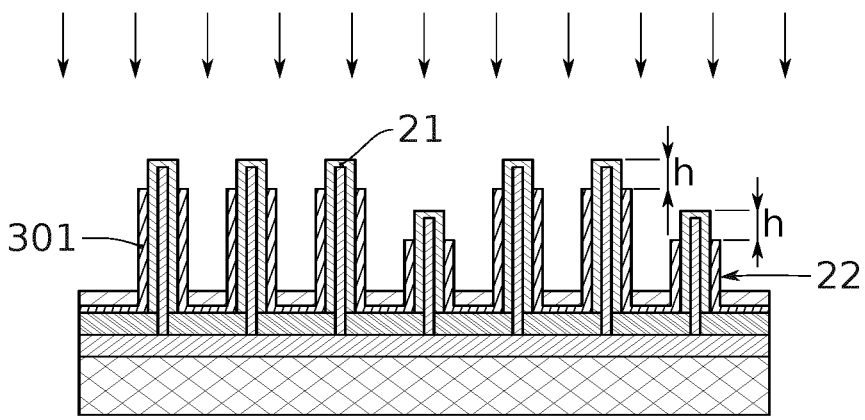

As illustrated in FIG. 2E, a second anisotropic plasma etching is then performed in order to remove a top part of the conformal dielectric layer 301 in the upper part of the SW 21.

This second anisotropic plasma etching is performed along the direction normal to the basal plane.

It makes it possible to etch first a part of the conformal dielectric layer 301 coating the top of the SW 21 then a part of the conformal dielectric layer 301 coating the sidewalls of the SW 21, in the upper part of the SW 21.

The second anisotropic plasma etching may have a selectivity S1 between the semiconductor-based material of the SW and the dielectric material of the conformal dielectric layer 301 such as S1>1:100, preferably S1>1:500.

This second anisotropic plasma etching may be based on fluorocarbonated species. It is for instance based on CF4 (tetrafluoromethane), SF6 (sulfur hexafluoride) or C2F6 (hexaflouroethane) or a mixture thereof. It may also comprise inert gazes such as argon.

In particular for GaN-based SW 21 and SiO2 as dielectric material, a selectivity GaN:SiO2>1:100 may be obtained using fluorocarbonated plasma.

The second anisotropic plasma etching is performed so as to obtain a top part of the SW 21 having a height h free of dielectric layer 301. The height h is measured from the top of the SW 21 and is preferably in the range 300 nm to 10 μm.

Each individual SW 21 is thus stripped in its upper part, while maintaining a part of the conformal dielectric layer 301 in its lower part.

The remaining part of the conformal dielectric layer 301 forms a dielectric collar 22 for each SW 21 (FIG. 2E).

Figure 2F:
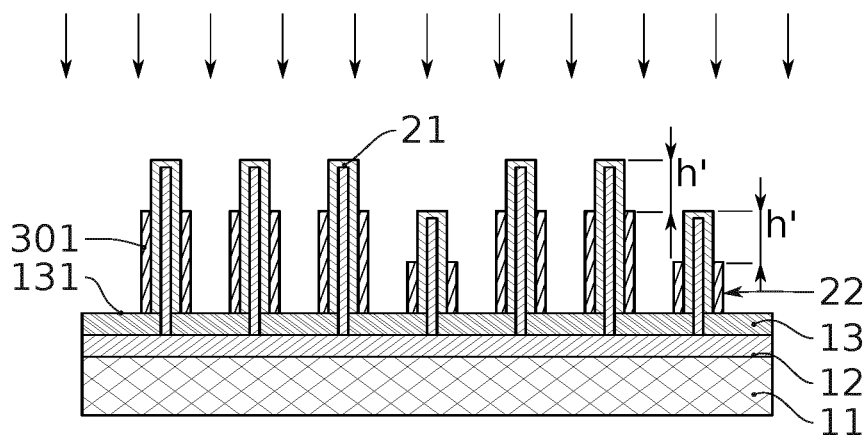

The second anisotropic plasma etching may be continued in order to expose the surface 131 of the SAG layer 13, as illustrated in FIG. 2F. If required, the residual photoresist layer may be removed prior to the second anisotropic plasma etching continuation.

The second anisotropic plasma etching may also have a selectivity S2 between the material of the SAG layer 13 and the dielectric material of the conformal dielectric layer 301 such as S2>1:5, preferably S2>1:10.

After continuation of the second anisotropic plasma etching, the top part of the SW 21 free of dielectric layer 301 then has a height h' (FIG. 2F). The height h' is measured from the top of the SW 21 and is preferably in the range 600 nm to 12 µm.

The dielectric collar 22 of a SW 21 is then unrelated to the adjacent dielectric collars 22 of the adjacent SW 21.

Wave guiding effects potentially occurring along the basal plane in the stack 10 may be lowered or suppressed.

For industrial manufacturing issues, it is important to have such a controlled height h or h' for all SW 21 in a reproducible way, whatever the height variation between the SW 21. The overall yield of SW-based devices may thus be improved.

Figure 2G:
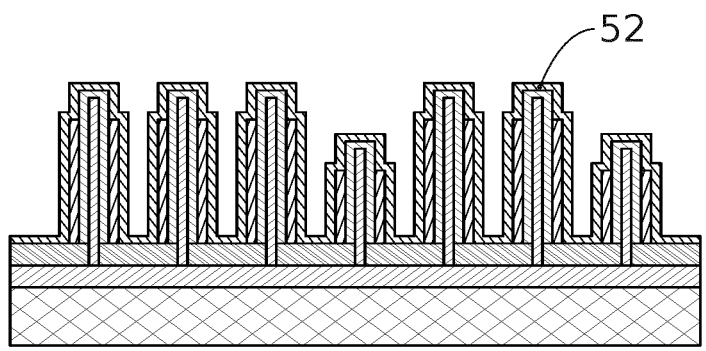

In order to form a SW-based LED, a Transparent Conductive Oxide (TCO) layer 52 may then be deposited (FIG. 2G). Such a TCO layer 52 is well known and may be made of Tin Indium Oxide (TIO), or doped-ZnO, or graphene for instance. It is intended to form an electrode to the top part of the SW 21 while being transparent to the light emitted by the SW 21.

Metallic contact pads may further be formed in a classical way to obtain a SW-based LED.

According to a second embodiment of the invention, the base layer 31 and the capping layer 32 are formed in a single step and comprise a single material. The overall method is thus simplified. It may also be more cost-effective.

Figure 3B:
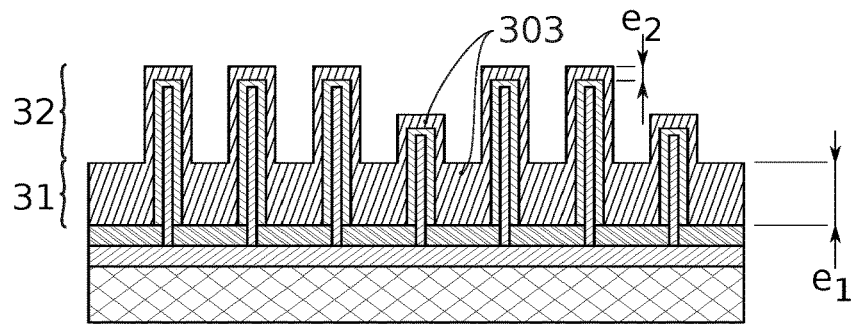

To achieve such base and capping layers 31, 32, a dielectric layer 303 is deposited by spin coating on the NW 21, as illustrated in FIG. 3B.

A part of this spin-coated dielectric layer 303 is ultimately intended to form the dielectric collar for the NW 21.

Therefore the following steps of the method are intended to shape this spin-coated dielectric layer 303 in such a way as to obtain the dielectric collar.

These steps correspond mutatis mutandis to the steps described above in the case of the first embodiment. It is therefore to be understood that features which may be adapted from the first embodiment to the second embodiment, even if not necessarily described, should be considered as part of the second embodiment.

According to this second embodiment, such a spin-coated dielectric layer 303 on SW 21 typically has a thick part lying between the SW 21, at a lower part of the SW 21, and a thin part covering the top of the SW 21 and possibly the sidewalls of the SW 21 at an upper part of the SW 21.

The spin-coated dielectric layer 303 can be formed by spin coating a Flowable Oxide (FOx) or spin-on Glass material which is further annealed. This layer formation technique is well known. In particular, the spin coating parameters may be adjusted according to the FOx or spin-on Glass features so as to obtain a thick part having a thickness in the range 600 nm to 6 µm thick together with a thin part, having as an example a thickness in the range 0 nm to 500 nm thick.

The thick part of this spin-coated dielectric layer 303 at the lower part of the SW 21 corresponds to the base layer 31 (FIG. 3B).

The thin part of this spin-coated dielectric layer 303 at the upper part of the SW 21 corresponds to the capping layer 32 (FIG. 3B).

The thickness e1 of the base layer 31 is then approximately equal to the thickness of the thick part of the spin-coated dielectric layer 303.

The thickness e2 of the capping layer 32 is then approximately equal to the thickness of the thin part of the spin-coated dielectric layer 303.

Figure 3C:
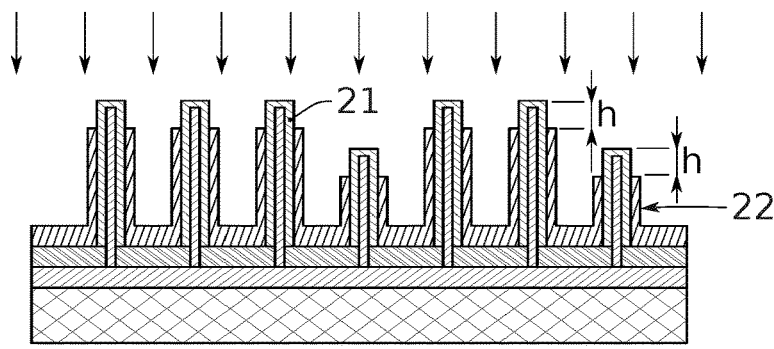

As illustrated in FIG. 3C, an anisotropic etching is performed along the direction normal to the basal plane so as to expose a top part of the SW 21.

The anisotropic plasma etching is performed in a similar way to the second anisotropic plasma etching of the first embodiment.

It is performed so as to obtain a top part of the SW 21 having a height h free of capping layer 32. The height h is preferably in the range 300 nm to 10 µm.

Each individual SW 21 is thus stripped in its upper part, while maintaining a part of the base layer 32 in its lower part.

The dielectric collar 22 is formed for each SW 21 (FIG. 3C).

Figure 3D:
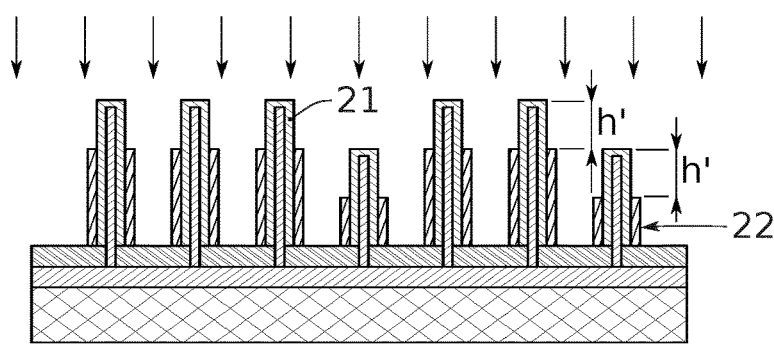

As for the first embodiment, the anisotropic plasma etching may be continued in order to expose the surface 131 of the SAG layer 13, as illustrated in FIG. 3D.

The top part of the SW 21 free of capping layer 32 then has a height h' (FIG. 3D). The height h' is preferably in the range 600 nm to 12 µm.

Figure 3E:
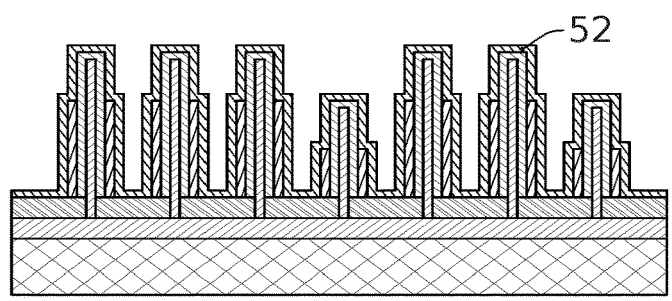

A TCO layer 52 may then be deposited (FIG. 3E), and metallic contact pads may further be formed in order to obtain a SW-based LED.

The invention is not limited to the embodiments previously described and extends to all the embodiments covered by the claims.

The invention claimed is:

1. A method of forming a dielectric collar for semiconductor wires comprising the following steps:
    provide a stack of layers comprising at least a substrate spreading along a basal plane, and a semiconductor wires layer lying on top of the stack and comprising semiconductor wires in a semiconductor-based material, said semiconductor wires being mainly oriented along a direction normal to the basal plane, said semiconductor wire layer comprising at least some semiconductor wires of different effective heights,
    form, at least partially by spin coating, a base layer at a lower part of the semiconductor wires, and a capping layer at an upper part of the semiconductor wires, the base layer spreading parallel to the basal plane and comprising at least a dielectric material surrounding the lower part of the semiconductor wires, and the capping layer spreading along a contour of the semiconductor wires and comprising at least the dielectric material surrounding the upper part of the semiconductor wires, the base layer and the capping layer having respectively a thickness $e1>0$ and a thickness $e2 \geq 0$ with $e1>2 \times e2$,
    perform an anisotropic etching along the direction normal to the basal plane so as to remove the dielectric material at least at a top part of the upper part of the semiconductor wires over a same height h whatever the different effective height of the semiconductor wire and so as to leave the dielectric material at least on the lower part of the semiconductor wires.

2. The method according to claim 1 wherein in the step of forming the base layer and the capping layer, the base layer and the capping layer both comprise the dielectric material and further including a photoresist material, and are formed from a first conformal deposition of the dielectric material followed by a second deposition of the photoresist material by spin coating.

3. The method according to claim 2 wherein the conformal deposition of the dielectric material is performed by one of the following deposition techniques: plasma-enhanced chemical vapor deposition (PECVD), Sub-atmospheric chemical vapor deposition (SACVD), Low Pressure Chemical Vapor Deposition (LPCVD) or Atomic Layer Deposition (ALD).

4. The method according to claim 1 wherein the base and capping layers both comprise only the dielectric material, and are formed only from a spin coating deposition of the dielectric material.

5. The method according to claim 1 wherein the anisotropic etching is continued so as to expose a surface of the stack.

6. The method according to claim 1 wherein the dielectric material is chosen among: SiO2, SiN or SiON.

7. The method according to claim 1 wherein the anisotropic etching is performed using at least a plasma comprising fluorocarbonated species.

8. The method according to claim 1 wherein the semiconductor wires have a height between 1 μm and 15 μm and a diameter between 0.7 μm and 3 μm.

9. The method according to claim 1 wherein the stack comprises at least a substrate, a nucleation layer, a growth masking layer, and wherein the semiconductor wires are at least partially grown from the nucleation layer through the growth masking layer.

10. The method according to claim 1 wherein the semiconductor-based material comprises gallium nitride (GaN).

11. The method according to claim 1 wherein e1>500 nm.

12. The method according to claim 1 wherein the top part of the semiconductor wires has the height h in the range 300 nm to 10 μm.

13. A method for manufacturing of semiconductor wires-based light emitting diode which comprises the method of forming a dielectric collar for semiconductor wires according to claim 1.

14. A method of forming a dielectric collar for semiconductor wires comprising the following steps:
provide a stack of layers comprising at least a substrate spreading along a basal plane, and a semiconductor wires layer lying on top of the stack and comprising semiconductor wires in a semiconductor-based material, said semiconductor wires being mainly oriented along a direction normal to the basal plane,
form, at least partially by spin coating, a base layer at a lower part of the semiconductor wires, and a capping layer at an upper part of the semiconductor wires, the base layer spreading parallel to the basal plane and comprising at least a dielectric material surrounding the lower part of the semiconductor wires, and the capping layer spreading along a contour of the semiconductor wires and comprising at least the dielectric material surrounding the upper part of the semiconductor wires, the base layer and the capping layer having respectively a thickness e1>0 and a thickness e2≥0 with e1>2×e2,
perform an anisotropic etching along the direction normal to the basal plane so as to remove the dielectric material at least at a top part of the upper part of the semiconductor wires over a height h and so as to leave the dielectric material at least on the lower part of the semiconductor wires,
wherein in the step of forming the base layer and the capping layer, the base layer and the capping layer both comprise the dielectric material and further including a photoresist material, and are formed from a first conformal deposition of the dielectric material followed by a second deposition of the photoresist material by spin coating.

15. A method of forming a dielectric collar for semiconductor wires comprising the following steps:
provide a stack of layers comprising at least a substrate spreading along a basal plane, and a semiconductor wires layer lying on top of the stack and comprising semiconductor wires in a semiconductor-based material, said semiconductor wires being mainly oriented along a direction normal to the basal plane,
form, at least partially by spin coating, a base layer at a lower part of the semiconductor wires, and a capping layer at an upper part of the semiconductor wires, the base layer spreading parallel to the basal plane and comprising at least a dielectric material surrounding the lower part of the semiconductor wires, and the capping layer spreading along a contour of the semiconductor wires and comprising at least the dielectric material surrounding the upper part of the semiconductor wires, the base layer and the capping layer having respectively a thickness e1>0 and a thickness e2≥0 with e1>2×e2,
perform an anisotropic etching along the direction normal to the basal plane so as to remove the dielectric material at least at a top part of the upper part of the semiconductor wires over a height h and so as to leave the dielectric material at least on the lower part of the semiconductor wires,
wherein in the step of forming the base layer and the capping layer, the base layer and the capping layer both comprise the dielectric material and further including a photoresist material, and are formed from a first conformal deposition of the dielectric material followed by a second deposition of the photoresist material by spin coating, and
wherein the conformal deposition of the dielectric material is performed by one of the following deposition techniques: plasma-enhanced chemical vapor deposition (PECVD), Sub-atmospheric chemical vapor deposition (SACVD), Low Pressure Chemical Vapor Deposition (LPCVD) or Atomic Layer Deposition (ALD).

* * * * *